(12) United States Patent
Chang et al.

(10) Patent No.: US 11,335,552 B2
(45) Date of Patent: May 17, 2022

(54) STRUCTURE AND FORMATION METHOD OF SEMICONDUCTOR DEVICE WITH OXIDE SEMICONDUCTOR CHANNEL

(71) Applicant: Taiwan Semiconductor Manufacturing Co., Ltd., Hsinchu (TW)

(72) Inventors: Chih-Yu Chang, New Taipei (TW); Sai-Hooi Yeong, Zhubei (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/851,876

(22) Filed: Apr. 17, 2020

(65) Prior Publication Data

US 2021/0327705 A1 Oct. 21, 2021

(51) Int. Cl.
  *H01L 29/66* (2006.01)
  *H01L 21/84* (2006.01)
  *H01L 21/02* (2006.01)
  *H01L 21/768* (2006.01)
  *H01L 21/762* (2006.01)

(52) U.S. Cl.
  CPC ...... *H01L 21/02104* (2013.01); *H01L 21/762* (2013.01); *H01L 21/76802* (2013.01)

(58) Field of Classification Search
  CPC .................................................. H01L 21/02104
  USPC .................. 438/156, 173, 192, 268; 257/183
  See application file for complete search history.

(56) References Cited

U.S. PATENT DOCUMENTS

| | | | | |
|---|---|---|---|---|
| 8,753,942 B2* | 6/2014 | Kuhn | ................ | H01L 29/66439 438/285 |
| 9,196,616 B2* | 11/2015 | Kato | ....................... | H01L 28/91 |
| 9,209,247 B2 | 12/2015 | Colinge et al. | | |
| 9,236,267 B2 | 1/2016 | De et al. | | |
| 9,412,817 B2 | 8/2016 | Yang et al. | | |
| 9,412,828 B2 | 8/2016 | Ching et al. | | |
| 9,472,618 B2 | 10/2016 | Oxland | | |
| 9,502,265 B1 | 11/2016 | Jiang et al. | | |
| 9,520,482 B1 | 12/2016 | Chang et al. | | |
| 9,536,738 B2 | 1/2017 | Huang et al. | | |
| 9,576,814 B2 | 2/2017 | Wu et al. | | |
| 9,608,116 B2 | 3/2017 | Ching et al. | | |
| 9,673,276 B2* | 6/2017 | Kim | ..................... | H01L 27/228 |
| 9,748,404 B1* | 8/2017 | Chang | .............. | H01L 29/66772 |
| 10,490,671 B2* | 11/2019 | Yamazaki | .......... | H01L 29/7869 |
| 10,741,660 B2* | 8/2020 | Loubet | .................. | H01L 27/092 |
| 10,854,612 B2* | 12/2020 | Cho | .................. | H01L 27/10885 |

(Continued)

*Primary Examiner* — Calvin Lee
(74) *Attorney, Agent, or Firm* — Birch, Stewart, Kolasch & Birch, LLP

(57) ABSTRACT

A semiconductor device structure and a method for forming a semiconductor device structure are provided. The semiconductor device structure includes an oxide semiconductor nanostructure suspended over a substrate. The semiconductor device structure also includes a source/drain structure adjacent to the oxide semiconductor nanostructure. The source/drain structure contains oxygen, and the oxide semiconductor nanostructure has a greater atomic concentration of oxygen than that of the source/drain structure. The semiconductor device structure further includes a gate stack wrapping around the oxide semiconductor nanostructure.

20 Claims, 7 Drawing Sheets

(56) References Cited

U.S. PATENT DOCUMENTS

| | | | |
|---|---|---|---|
| 10,957,784 B2* | 3/2021 | Wong | H01L 29/0673 |
| 2018/0151732 A1* | 5/2018 | Mehandru | H01L 29/7848 |
| 2020/0083339 A1* | 3/2020 | Cheng | H01L 29/785 |
| 2020/0105889 A1* | 4/2020 | Liaw | H01L 29/0673 |
| 2020/0219973 A1* | 7/2020 | Van Dal | H01L 21/8221 |
| 2020/0227570 A1* | 7/2020 | Chen | H01L 29/66439 |
| 2020/0266271 A1* | 8/2020 | Lin | H01L 27/0886 |
| 2020/0343377 A1* | 10/2020 | Chiang | H01L 21/823814 |
| 2021/0098589 A1* | 4/2021 | Cheng | H01L 21/823412 |
| 2021/0098634 A1* | 4/2021 | Chung | H01L 29/775 |
| 2021/0134952 A1* | 5/2021 | Fung | H01L 29/41791 |
| 2021/0134970 A1* | 5/2021 | Lee | H01L 21/823418 |

* cited by examiner

STRUCTURE AND FORMATION METHOD OF SEMICONDUCTOR DEVICE WITH OXIDE SEMICONDUCTOR CHANNEL

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
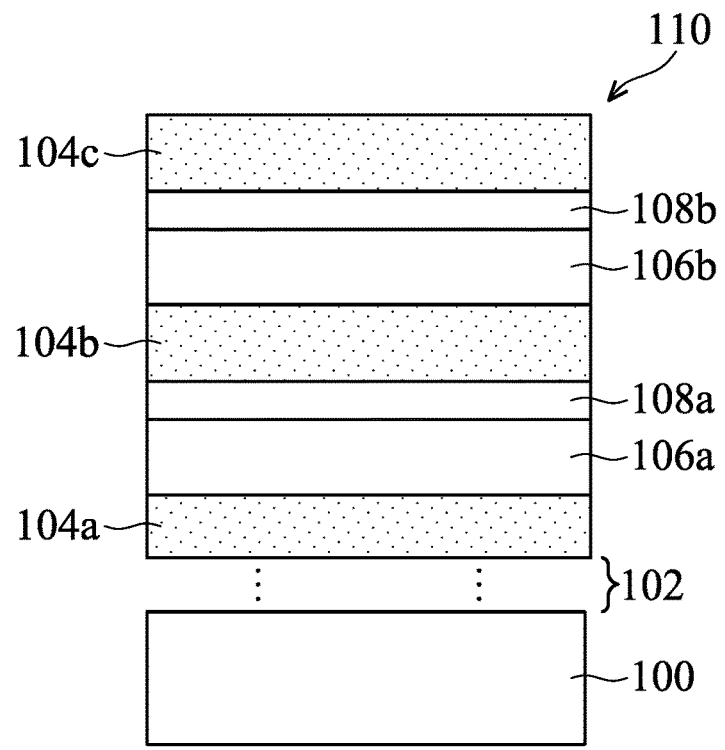
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1I are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, various device elements are formed in and/or on the semiconductor substrate 100. Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, one or more other applicable processes, or a combination thereof.

As shown in FIG. 1A, an interconnection portion 102 is formed on the semiconductor substrate 100, in accordance with some embodiments. For clarity and simplicity, the detail of the interconnection portion 102 is not shown. The interconnection portion 102 may include multiple dielectric layers and multiple conductive features among the dielectric layers. The conductive features may include conductive contacts, conductive lines, and/or conductive vias. The formation of the dielectric layers and the conductive features may involve multiple deposition processes, patterning processes, and planarization processes. The device elements formed in and/or on the semiconductor substrate 100 may be interconnected through the conductive features of the interconnection portion 102. As a result, a variety of circuits are formed.

In some embodiments, a stack having multiple material layers is formed over the semiconductor substrate 100 and the interconnection portion 102, in accordance with some embodiments. In some embodiments, the stack includes multiple sacrificial layers 104a, 104b, and 104c, and the stack also includes multiple oxide semiconductor layers 106a and 106b. In some embodiments, the sacrificial layers 104a-104c and the oxide semiconductor layers 106a-106b are laid out alternately, as shown in FIG. 1A.

In some embodiments, the sacrificial layers 104a-104c will be partially removed in a subsequent process to release portions of the oxide semiconductor layers 106a-106b. The released portions of the oxide semiconductor layers 106a-106b may function as channel structures of one or more transistors.

In some embodiments, the stack further includes multiple oxygen-scavenging layers 108a and 108b. The sacrificial layers 104a-104c, the oxide semiconductor layers 106a-106b, and the oxygen-scavenging layers 108a-108b are laid out alternately, as shown in FIG. 1A in accordance with some embodiments. In some embodiments, each of the oxygen-scavenging layers 108a-108b is formed on a respective oxide semiconductor layer of the oxide semiconductor layers 106a-106b. In some embodiments, the oxygen-scavenging layers 108a and 108b are formed directly on the oxide semiconductor layers 106a and 106b, respectively.

In some embodiments, the sacrificial layers 104a-104c are made of or include a dielectric material. The dielectric material may be silicon nitride, silicon oxynitride, silicon carbide, carbon-containing silicon oxide, carbon-containing silicon oxynitride, or a combination thereof. In some embodiments, the oxide semiconductor layers 106a-106b are made of or include indium gallium zinc oxide (IGZO), zinc oxide, gallium oxide, tin oxide, strontium titanium oxide, one or more other suitable oxygen-containing semiconductor materials, or a combination thereof.

Each of the oxide semiconductor layers 106a-106b may have a thickness greater than about 20 nm. For example, each of the oxide semiconductor layers 106a-106b may have a thickness that is in a range from about 20 nm to about 50 nm. In some embodiments, the oxygen-scavenging layers 108a-108b may be made of or include titanium, titanium nitride, tungsten, one or more other suitable materials, or a combination thereof. Each of the oxygen-scavenging layers 108a-108b may have a thickness that is in a range from about 5 nm to about 20 nm. For example, each of the oxygen-scavenging layers 108a-108b may have a thickness of about 10 nm.

However, embodiments of the disclosure are not limited thereto. Many variations and/or modifications can be made to embodiments of the disclosure. In some other embodiments, the oxygen-scavenging layers 108a-108b are not formed.

In some embodiments, the sacrificial layers 104a-104c, the oxide semiconductor layers 106a-106b, and the oxygen-scavenging layers 108a-108b are formed using multiple deposition processes. Each of the sacrificial layers 104a-104c, the oxide semiconductor layers 106a-106b, and the oxygen-scavenging layers 108a-108b may be formed using a chemical vapor deposition (CVD) process, an atomic layer deposition (ALD) process, a physical vapor deposition (PVD) process, one or more other applicable processes, or a combination thereof.

In some embodiments, the sacrificial layers 104a-104c, the oxide semiconductor layers 106a-106b, and the oxygen-scavenging layers 108a-108b are deposited in-situ in the same process chamber. In some embodiments, the deposition of the sacrificial layers 104a-104c, the oxide semiconductor layers 106a-106b, and the oxygen-scavenging layers 108a-108b are alternately and sequentially performed in the same process chamber to complete the formation of the stack. In some embodiments, the vacuum of the process chamber is not broken before the epitaxial growth of the stack is accomplished.

Afterwards, hard mask elements are formed over the stack to assist in a subsequent patterning of the stack. One or more etching processes are used to pattern the stack into multiple fin structures 110, in accordance with some embodiments. As shown in FIG. 1A, one of the fin structures 110 is shown. Each of the fin structures 110 may include portions of the sacrificial layers 104a-104c, the oxide semiconductor layers 106a-106b, and the oxygen-scavenging layers 108a-108b. After the formation of the fin structures 110, the hard mask elements may be removed.

Figure 1B:
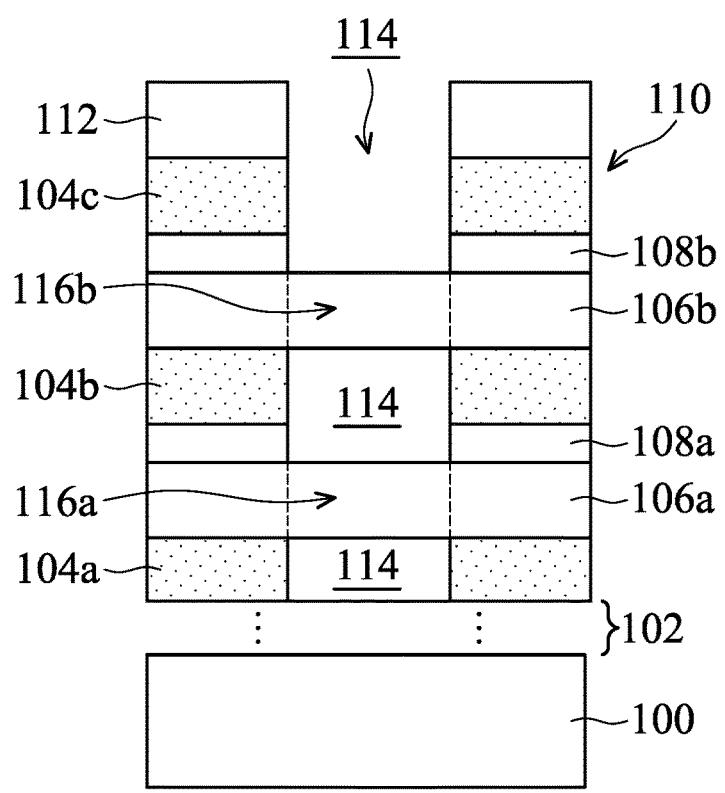

As shown in FIG. 1B, a mask element 112 is formed over the fin structure 110, in accordance with some embodiments. The mask element 112 has an opening that partially exposes the fin structure 110. The exposed region of the fin structure 110 may be a predetermined region where one or more channel nanostructures will be formed.

Afterwards, with the mask element 112 as an etching mask, the sacrificial layers 104a-104c and the oxygen-scavenging layers 108a-108b are partially removed to form a recess 114, as shown in FIG. 1B in accordance with some embodiments. The recess 114 partially exposes the oxide semiconductor layers 106a-106b. One or more etching processes may be used to form the recess 114. The etching process(es) may include a dry etching process, a wet etching process, or a combination thereof. Afterwards, the mask element 112 may be removed.

As shown in FIG. 1B, the inner portions of the oxide semiconductor layers 106a-106b, that are exposed or released by the recess 114, form multiple oxide semiconductor nanostructures 116a and 116b. The oxide semiconductor nanostructures 116a and 116b may function as channel structures of one or more transistors after the subsequent processes are finished. The outer portions of the oxide semiconductor layers 106a-106b, that are covered without being exposed by the recess 114, may function as source/drain structures of one or more transistors after the subsequent processes are finished. For example, the one or more transistors may include enhancement-mode transistors with oxygen vacancy as dopant.

Figure 1C:
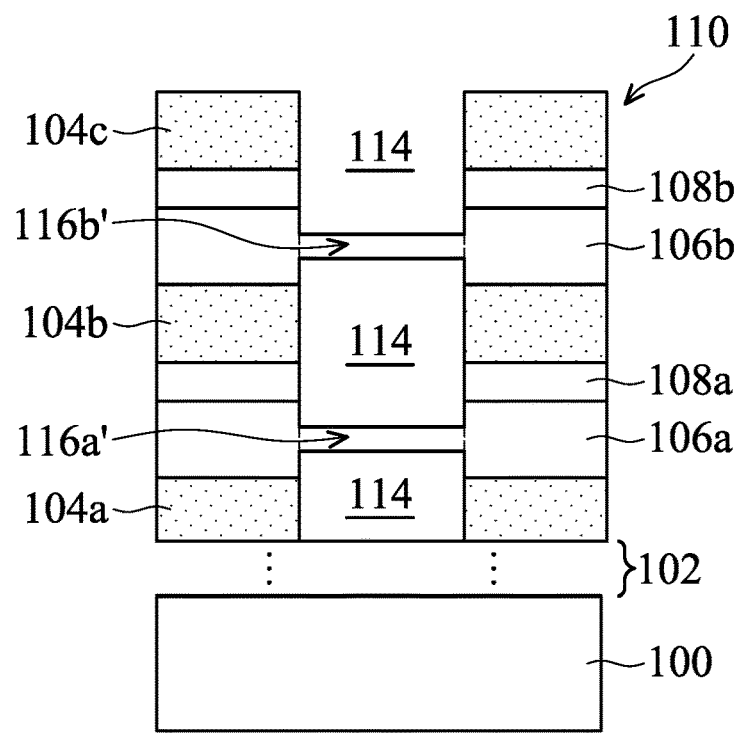

As shown in FIG. 1C, the oxide semiconductor nanostructures 116a and 116b are respectively trimmed to form trimmed oxide semiconductor nanostructures 116a' and 116b', in accordance with some embodiments. As a result, each of the trimmed oxide semiconductor nanostructures 116a' and 116b' is thinner than the respective source/drain structures (i.e., the respective covered outer portions of the oxide semiconductor layers 106a-106b) that will be formed after the subsequent processes are finished. The covered outer portions of the oxide semiconductor layers 106a-106b sandwich the trimmed oxide semiconductor nanostructures 116a'or 116b'. In some embodiments, the trimmed oxide semiconductor nanostructures 116a' and 116b' are nanosheets, nanowires, or other nanostructures with different shapes or profiles.

In some embodiments, one or more etching processes are used to form the trimmed oxide semiconductor nanostructures 116a'or 116b'. The etching process(es) may include a wet etching process, a dry etching process, or a combination thereof. Each of the trimmed oxide semiconductor nanostructures 116a' and 116b' may have a thickness that is in a range from about 5 nm to about 20 nm. In some embodiments, the thickness of each of the trimmed oxide semiconductor nanostructures 116a' and 116b' is smaller than about 10 nm.

Due to the trimming, the resistance of the trimmed oxide semiconductor nanostructures 116a' and 116b' may be increased, which may lead to an improvement of the threshold voltage of the one or more transistors. The performance and reliability of the one or more transistors are thus enhanced.

However, embodiments of the disclosure are not limited thereto. Many variations and/or modifications can be made to embodiments of the disclosure. In some other embodiments, the oxide semiconductor nanostructures 116a and 116b are directly used as the channel structures of one or more transistors without being trimmed.

Figure 1D:
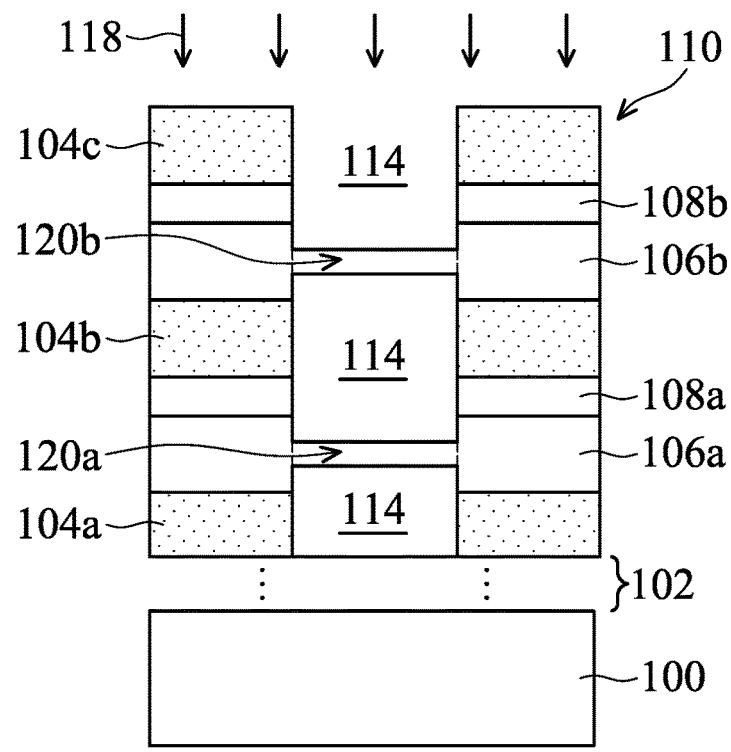

As shown in FIG. 1D, oxygen is introduced into the trimmed oxide semiconductor nanostructures 116a' and 116b' to respectively form oxide semiconductor channels 120a and 120b, in accordance with some embodiments. As a result, the atomic concentration of oxygen of the oxide semiconductor channels 120a and 120b are increased when compared to that of the trimmed oxide semiconductor nanostructures 116a'or 116b' or that of the covered outer portions of the oxide semiconductor layers 106a-106b. Some oxygen vacancy may be occupied by the introduced oxygen. As a result, the concentration of oxygen vacancy (or dopant concentration) of the oxide semiconductor channels 120a and 120b are decreased when compared to that of the trimmed oxide semiconductor nanostructures 116a'or 116b' or that of the covered outer portions of the oxide semiconductor layers 106a-106b.

Due the oxidation of the channel structures, the dopant concentration of the oxide semiconductor channels 120a and 120b may be fine-tuned, which facilitates the performance of the one or more transistors. The dopant concentration of the oxide semiconductor channels 120a and 120b may be in a range from about $10^{16}$ cm$^{-3}$ to about $10^{17}$ cm$^{-3}$.

In some embodiments, the introduction of oxygen into the trimmed oxide semiconductor nanostructures 116a' and 116b' (for forming the oxide semiconductor channels 120a and 120b) is performed by an annealing process 118. In the annealing process 118, the trimmed oxide semiconductor nanostructures 116a' and 116b' are heated under an oxygen-containing atmosphere. The oxygen-containing atmosphere may include oxygen ($O_2$), ozone ($O_3$), oxygen plasma, or the like. The annealing temperature may be in a range from about 200 degrees C. to about 600 degrees C. Alternatively, the annealing temperature may be in a range from about 300 degrees C. to about 500 degrees C.

However, embodiments of the disclosure are not limited thereto. Many variations and/or modifications can be made to embodiments of the disclosure. In some other embodiments, the introduction of oxygen is performed using an ion implantation process. Oxygen-containing dopants are implanted into the trimmed oxide semiconductor nanostructures 116a' and 116b'. As a result, the oxide semiconductor channels 120a and 120b are formed.

Figure 1E:
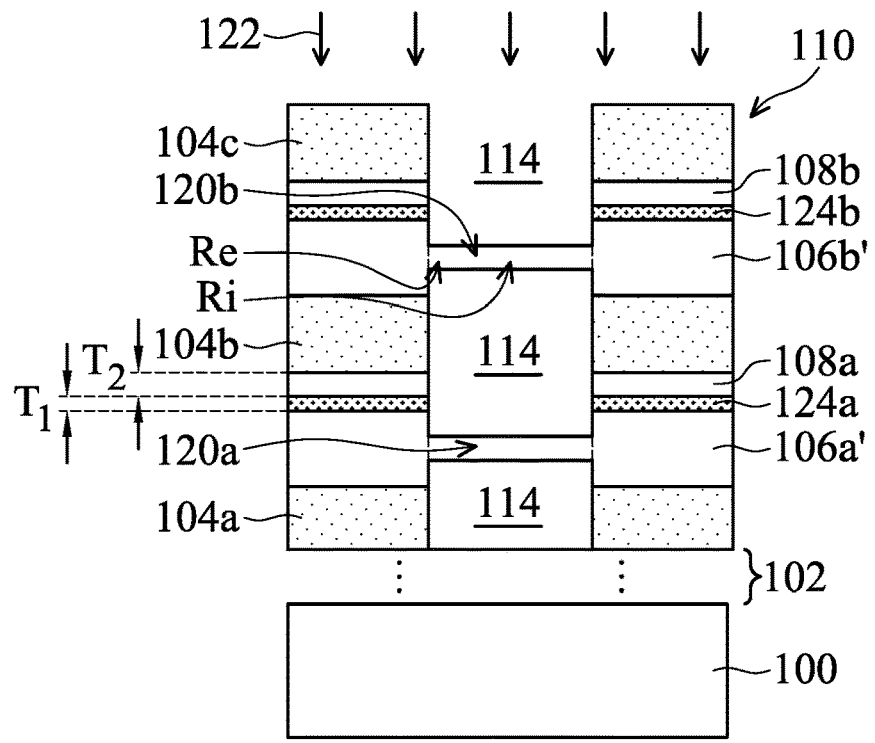

As shown in FIG. 1E, the atomic concentration of oxygen of the covered outer portions of the oxide semiconductor layers 106a-106b is reduced, in accordance with some embodiments. As a result, source/drain structures 106a' and 106b' are formed. In some embodiments, oxygen atoms are removed from the covered outer portions of the oxide semiconductor layers 106a-106b, which form multiple oxygen vacancies. As a result, the concentration of oxygen vacancy (or dopant concentration) of the covered outer portions of the oxide semiconductor layers 106a-106b are increased, so as to form the source/drain structures 106a' and 106b'.

Due the removal of oxygen, more oxygen vacancies may be formed, leading to an increase of the dopant concentration of the source/drain structures 106a' and 106b'. The performance of the semiconductor device structure is improved. The dopant concentration of the source/drain structures 106a' and 106b' may be in a range from about $10^{19}$ cm$^{-3}$ to about $10^{21}$ cm$^{-3}$. For example, the dopant concentration of the source/drain structures 106a' and 106b' may be about $10^{20}$ cm$^{-3}$.

In some embodiments, the removal of oxygen is achieved using an oxygen scavenging process 122. In some embodiments, during the oxygen scavenging process 122, the covered outer portions of the oxide semiconductor layers 106a-106b and the oxygen-scavenging layers 108a-108b are annealed under an atmosphere that contains substantially no oxygen. As a result, some oxygen atoms or oxygen-containing ions in the covered outer portions of the oxide semiconductor layers 106a-106b may diffuse into or enter the oxygen-scavenging layers 108a-108b, so as to form oxygen vacancies. The source/drain structures 106a' and 106b' having greater dopant concentration (or oxygen vacancy concentration) are thus formed. The annealing temperature of the oxygen scavenging process 122 may be in a range from about 300 degrees C. to about 600 degrees C. Alternatively, the annealing temperature of the oxygen scavenging process 122 may be in a range from about 400 degrees C. to about 500 degrees C.

In some embodiments, since some oxygen atoms or oxygen-containing ions enter the oxygen-scavenging layers 108a-108b, portions of the oxygen-scavenging layers 108a-108b adjacent to the source/drain structures 106a' and 106b' are transformed into metal oxide layers 124a and 124b, as shown in FIG. 1E in accordance with some embodiments. The metal oxide layers 124a and 124b may be made of or include titanium oxide, titanium oxynitride, tungsten oxide, one or more other suitable materials, or a combination thereof. In some embodiments, the metal oxide layers 124a and 124b and the oxygen-scavenging layers 108a and 108b contain the same metal element. For example, the same metal element is titanium or tungsten.

In some embodiments, the metal oxide layer 124a or 124b has a lower portion and an upper portion. The lower portion is between the upper portion and the source/drain structure 106a' or 106b'. In some embodiments, the lower portion of the metal oxide layer 124a or 124b has a greater atomic concentration of oxygen than that of the upper portion of the metal oxide layer 124a or 124b. In some embodiments, the atomic concentration of oxygen of the metal oxide layer 124a or 124b gradually decreases along a direction from the bottom surface towards the top surface of the metal oxide layer 124a or 124b.

As shown in FIG. 1E, each of the metal oxide layers 124a and 124b may have a thickness $T_1$, and each of the remaining oxygen-scavenging layers 108a-108b may have a thickness $T_2$. In some embodiments, the thickness $T_2$ is greater than the thickness $T_1$. In some other embodiments, the thickness $T_2$ is substantially equal to the thickness $T_1$. In some other embodiments, the thickness $T_2$ is smaller than the thickness $T_1$.

As shown in FIG. 1E, each of the oxide semiconductor channels 120a and 120b has a center portion Ri and edge portions Re. Each of the edge portions Re is between the center portion Ri and the source/drain structure 106a' or 106b'. In some embodiments, during the oxygen scavenging process 122, some oxygen atoms or oxygen-containing ions may enter into the source/drain structure 106a' or 106b' from the edge portions Re of the oxide semiconductor channels 120a or 120b. The center portion Ri has a first atomic concentration of oxygen, and each of the edge portion Re has a second atomic concentration of oxygen. In some embodiments, the first atomic concentration of oxygen is greater than the second atomic concentration of oxygen.

Figure 1F:
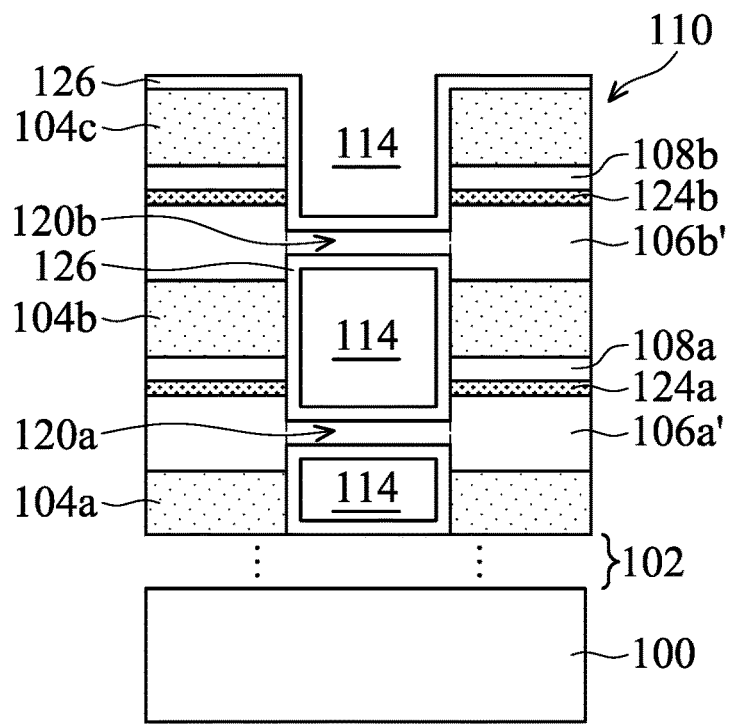

As shown in FIG. 1F, a spacer layer 126 is deposited over the fin structure 110, in accordance with some embodiments. The spacer layer 126 extends into the recess 114 along the sidewalls and bottom of the recess 114. The spacer layer 126 may further extend along the surfaces of the oxide semiconductor channels 120a and 120b to wrap around the oxide semiconductor channels 120a and 120b. The spacer layer 126 may be made of or include silicon nitride, silicon carbide, silicon oxynitride, carbon-containing silicon oxide, carbon-containing silicon oxynitride, one or more other suitable materials, or a combination thereof. The spacer layer 126 may be deposited using a CVD process, an ALD process, one or more other applicable processes, or a combination thereof.

Figure 1G:
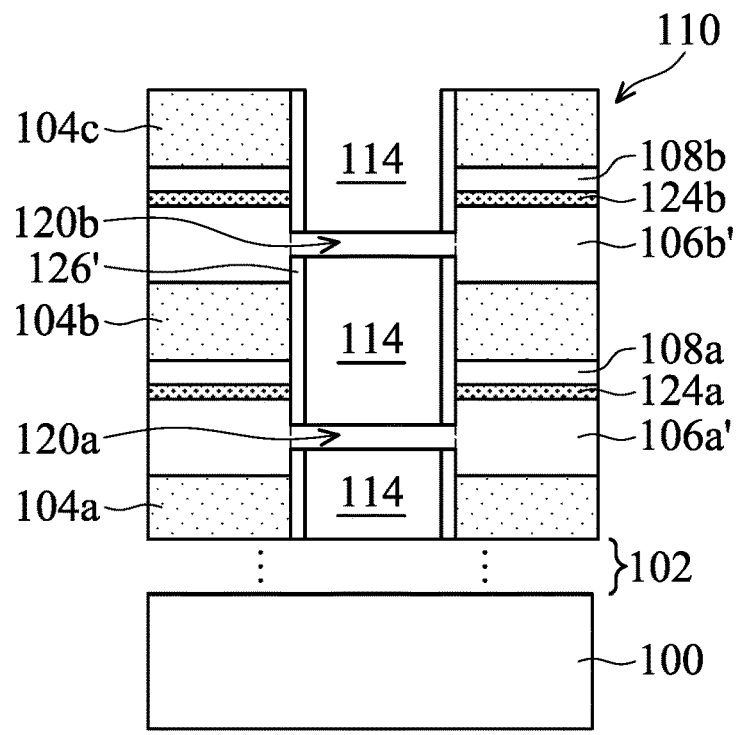

As shown in FIG. 1G, the spacer layer 126 is partially removed to partially expose the oxide semiconductor channels 120a and 120b, in accordance with some embodiments. One or more anisotropic etching processes may be used to partially remove the spacer layer 126. As a result, remaining portions of the spacer layer 126 form spacer elements 126'.

The spacer elements 126' extend along the sidewalls of the recess 114 to cover the portions of the source/drain structures 106a' and 106b' that are originally exposed before the formation of the spacer layer 126. The spacer elements 126' may be used to protect the source/drain structures 106a' and 106b' during a subsequent process for forming a gate stack. The spacer elements 126' may also be used to reduce parasitic capacitance between the source/drain structures 106a' and 106b' and the subsequently formed gate stack.

Figure 1H:
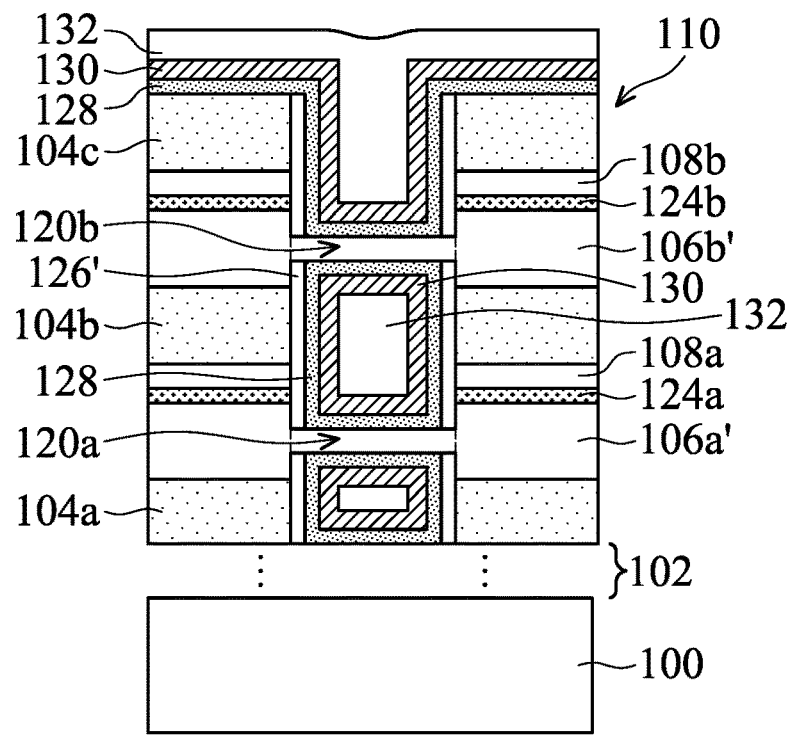

As shown in FIG. 1H, multiple metal gate stack layers and a dielectric filling layer 132 are sequentially deposited to overfill the recess 114 and wrap around the oxide semiconductor channels 120a and 120b, in accordance with some embodiments. The metal gate stack layers may include a gate dielectric layer 128 and a work function layer 130. In some embodiments, the gate dielectric layer 128 is made of or includes silicon oxide, silicon oxynitride, aluminum oxide, hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable materials, or a combination thereof. The gate dielectric layer 128 may be deposited using an ALD process, a CVD process, one or more other applicable processes, or a combination thereof.

The work function layer 130 may be used to provide the desired work function for transistors to enhance device performance including improved threshold voltage. The work function layer 130 may be made of or include metal, metal carbide, metal nitride, one or more other suitable materials, or a combination thereof. For example, the work function layer 130 may include tantalum nitride, tungsten nitride, titanium, titanium nitride, molybdenum, tungsten, one or more other suitable materials, or a combination thereof. The thickness and/or the compositions of the work function layer 130 may be fine-tuned to adjust the work function level. The work function layer 130 may be deposited over the gate dielectric layer 128 using an ALD process, a CVD process, a PVD process, an electroplating process, an electroless plating process, one or more other applicable processes, or a combination thereof.

In some embodiments, a barrier layer is formed before the work function layer 130 to interface the gate dielectric layer 128 with the subsequently formed work function layer 130. The barrier layer may also be used to prevent diffusion between the gate dielectric layer 128 and the subsequently formed work function layer 130. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

The dielectric filling layer 132 may be made of or include silicon oxide, silicon oxynitride, carbon-containing silicon oxide, one or more other suitable materials, or a combination thereof. The dielectric filling layer 132 may be used to fill the remaining space of the recess 114 that is not occupied by the metal gate stack layers. The dielectric filling layer 132 may be deposited using a flowable chemical vapor deposition (FCVD) process, a CVD process, an ALD process, one or more other applicable processes, or a combination thereof.

Figure 1I:
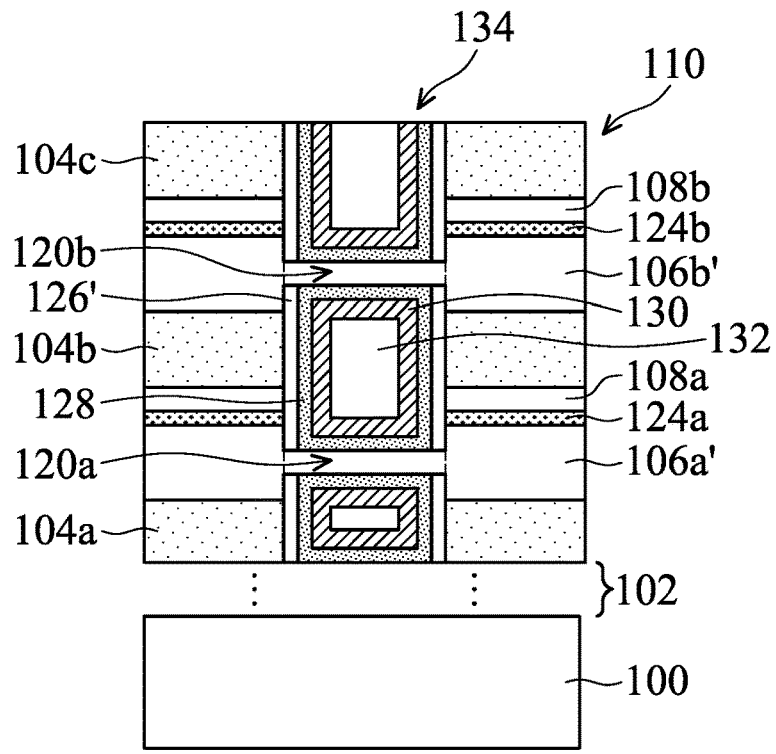

As shown in FIG. 1I, a planarization process is performed to remove the portions of the metal gate stack layers and the dielectric filling layer 132 that are outside of the recess 114, in accordance with some embodiments. As a result, the remaining portions of the metal gate stack layers form the metal gate stack 134, as shown in FIG. 1I. The metal gate stack 134 wraps around the oxide semiconductor channels 120a and 120b. The planarization process may include a chemical mechanical polishing (CMP) process, a grinding process, an etching process, one or more other applicable processes, or a combination thereof.

In some embodiments, the oxide semiconductor channels 120a and 120b is made of an oxide semiconductor material (such as indium gallium zinc oxide) having a first concentration of oxygen vacancy. The source/drain structures 106a' and 106b' are made of a similar oxide semiconductor material (such as indium gallium zinc oxide) having a second concentration of oxygen vacancy. In some embodiments, the second concentration of oxygen vacancy is greater than the first concentration of oxygen vacancy. The oxide semiconductor channels 120a and 120b may function as n regions, and the source/drain structures 106a' and 106b' may function as $n^+$ regions. As a result, $n^+$-n-$n^+$ junctions of one or more enhancement-mode transistors are formed.

Figure 2:
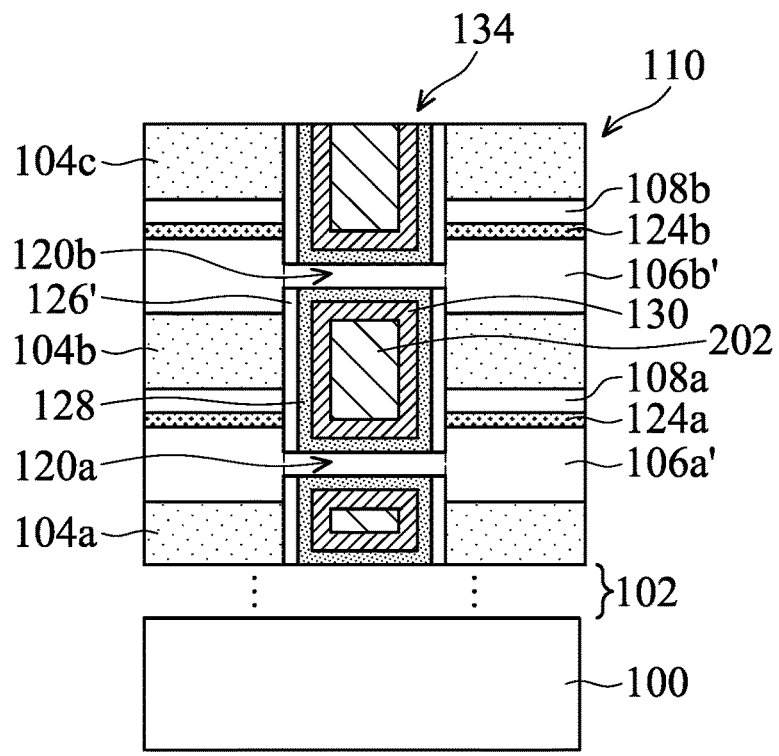
FIG. 2 is a cross-sectional view of a semiconductor device structure, in accordance with some embodiments.

Many variations and/or modifications can be made to embodiments of the disclosure. FIG. 2 is a cross-sectional view of a semiconductor device structure, in accordance with some embodiments. In some embodiments, the dielectric filling layer 132 is not formed to fill the recess 114. In some embodiments, the metal gate stack 134 further includes a conductive filling 202.

In some embodiments, the conductive filling 202 are made of or include a metal material. The metal material may include tungsten, aluminum, copper, cobalt, one or more other suitable materials, or a combination thereof. A conductive layer used for forming the conductive filling 202 may be deposited over the work function layer 130 to fill the remaining space of the recess 114. The conductive layer may be deposited using a CVD process, an ALD process, a PVD process, an electroplating process, an electroless plating process, a spin coating process, one or more other applicable processes, or a combination thereof.

In some embodiments, a blocking layer is formed over the work function layer 130 before the formation of the conductive layer used for forming the conductive filling 202. The blocking layer may be used to prevent the subsequently formed conductive layer from diffusing or penetrating into the work function layer 130. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, similar to the embodiments illustrated in FIG. 1I, a planarization process is performed. As a result, the metal gate stack 134 that includes the conductive filling 202 is formed, as shown in FIG. 2 in accordance with some embodiments.

Figure 3:
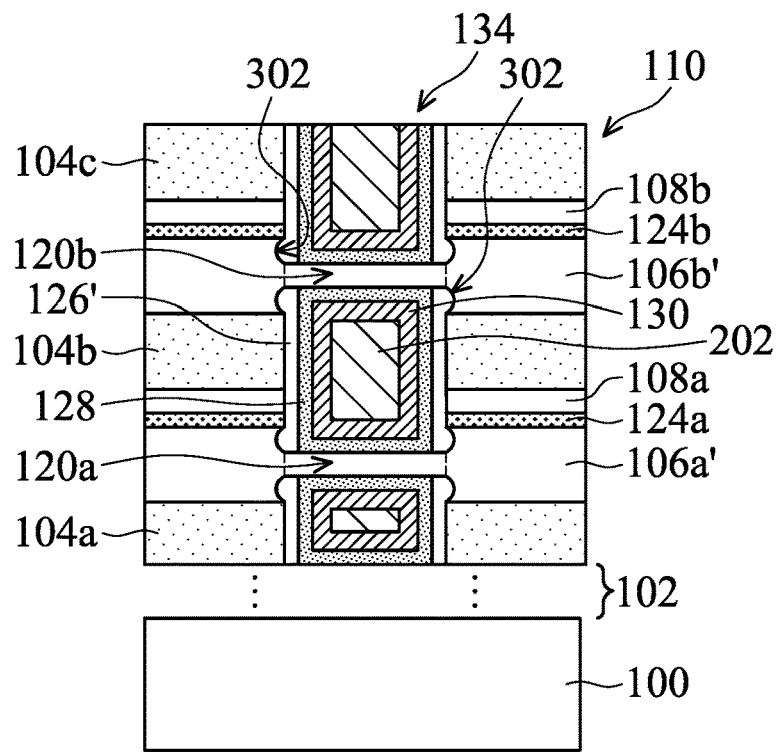
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments. In some embodiments, during the trimming process as illustrated in FIG. 1C, recesses are formed near the edges of the trimmed oxide semiconductor nanostructures due to lateral etch from the sidewalls of the covered portions of the oxide semiconductor layers 106a-106b. Afterwards, the processes as illustrated in FIGS. 1D-1I and/or 2 are performed. As a result, the structure shown in FIG. 3 is formed. In some embodiments, the source/drain structures 106a' and 106b' have curved (or arched) sidewalls 302, as shown in FIG. 3.

Figure 4:
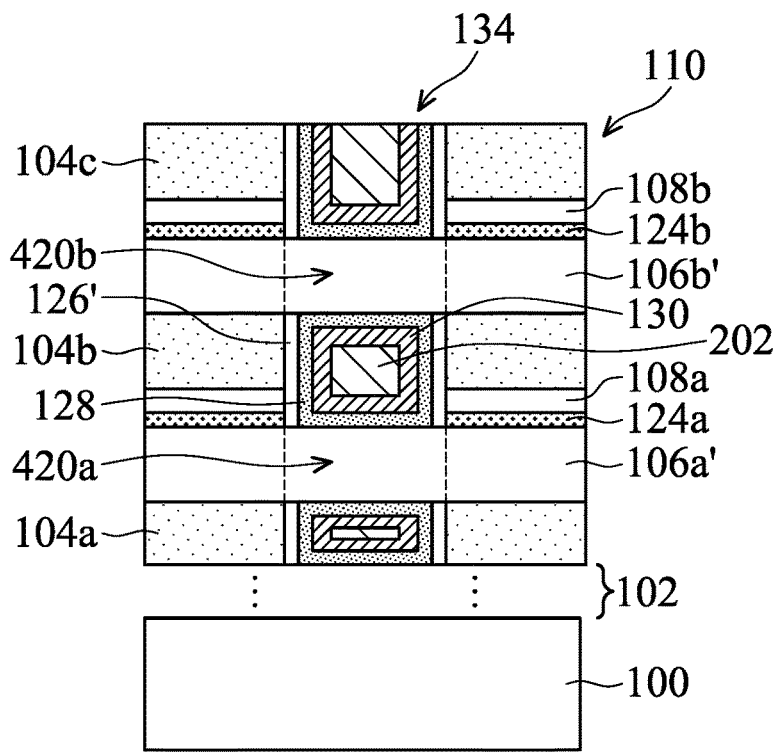
FIG. 4 is a cross-sectional view of a semiconductor device structure, in accordance with some embodiments.

Many variations and/or modifications can be made to embodiments of the disclosure. FIG. 4 is a cross-sectional view of a semiconductor device structure, in accordance with some embodiments. In some embodiments, the trimming process as illustrated in FIG. 1C is not performed. Afterwards, the processes similar to those shown in FIGS. 1D-1I and/or 2 are performed. As a result, the structure with the shown in FIG. 4 is formed. In some embodiments, the structure has multiple oxide semiconductor channels 420a and 420b. In some embodiments, each of the oxide semiconductor channels 420a and 420b is substantially as thick as each of the source/drain structures 106a' and 106b'.

Figure 5:
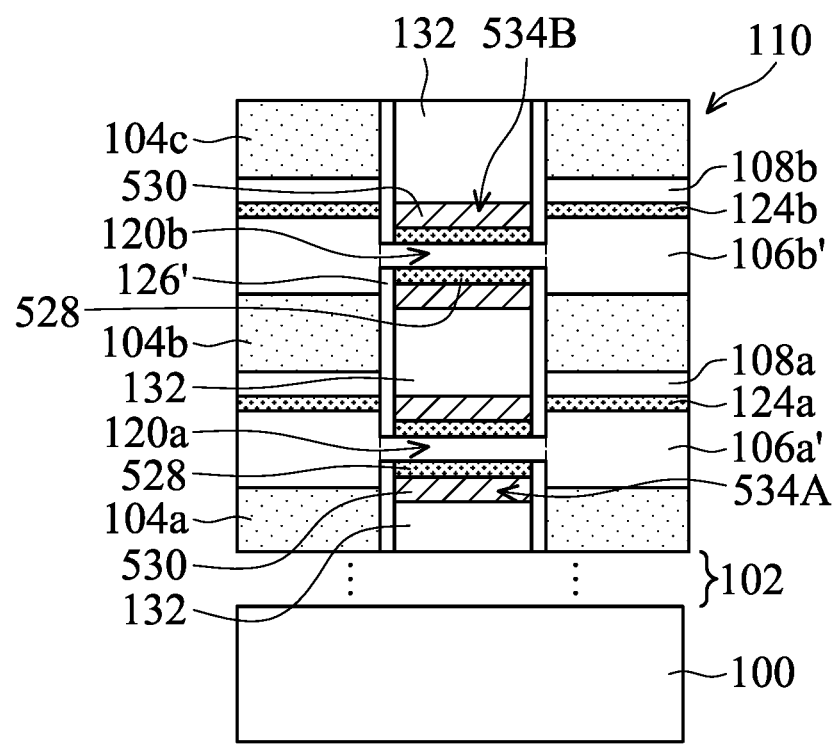
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments. In some embodiments, multiple metal gate stacks 534A and 534B are formed to wrap around the oxide semiconductor channels 120a and 120b, respectively. The dielectric filling 132 may also be used to electrically isolate the metal gate stack 534A from the metal gate stack 534B. The metal gate stack 534A together with the oxide semiconductor channel 120a and the source/drain structures 106a' may form a first transistor. The metal gate stack 534B together with the oxide semiconductor channel 120b and the source/drain structures 106b' may form a second transistor.

In some embodiments, each of the metal gate stacks 534A and 534B includes a gate dielectric layer 528 and a work function layer 530. The materials of the gate dielectric layer 528 and the work function layer 530 may be the same as or similar to those of the gate dielectric layer 128 and the work function layer 130, respectively.

In some embodiments, a structure the same as or similar to that shown in FIG. 1G is formed. Afterwards, the gate dielectric layer 528 is selectively deposited on the surfaces of the oxide semiconductor channels 120a and 120b, in accordance with some embodiments. The gate dielectric layer 528 may be selectively deposited using an ALD process, a CVD process, one or more other applicable processes, or a combination thereof. The precursor material used for forming the gate dielectric layer 528 may tend to be formed on the surfaces of the oxide semiconductor channels 120a and 120b and tend not to be formed on the surfaces of the spacer elements 126'.

Afterwards, the work function layer 530 is selectively deposited on the surfaces of the gate dielectric layer 528, in accordance with some embodiments. The work function layer 530 may be selectively deposited using an ALD process, a CVD process, one or more other applicable processes, or a combination thereof. The precursor material used for forming the work function layer 530 may tend to be formed on the surfaces of the gate dielectric layer 528 and tend not to be formed on the surfaces of the spacer elements 126'.

Afterwards, similar to the embodiments illustrated in FIG. 1H, the dielectric filling layer 132 is deposited to fill the remaining space of the recess 114, in accordance with some embodiments. Then, similar to the embodiments illustrated in FIG. 1I, a planarization process is performed to remove the portion of the dielectric filling layer 132 outside of the recess 114. As a result, the structure shown in FIG. 5 is formed.

In some embodiments, there are two oxide semiconductor channels 120a and 120b formed. However, embodiments of the disclosure are not limited thereto. Many variations and/or modifications can be made to embodiments of the disclosure. In some embodiments, there are more than two oxide semiconductor channels. In some other embodiments, there is only one oxide semiconductor channel wrapped around by the metal gate stack formed. The total number of oxide semiconductor channels (or oxide semiconductor nanostructures) of the semiconductor device structure may be fine-tuned according to the requirement.

Embodiments of the disclosure form a semiconductor device structure with a GAA transistor structure. The channels and/or the source/drain structures of the GAA transistor structure is made of an oxide semiconductor material. The performance and reliability of the GAA transistor structure can be significantly improved by channel body trimming, oxidation of the channels, and/or oxygen scavenging at the source/drain structures.

In accordance with some embodiments, a semiconductor device structure is provided. The semiconductor device structure includes an oxide semiconductor nanostructure suspended over a substrate. The semiconductor device structure also includes a source/drain structure adjacent to the oxide semiconductor nanostructure. The source/drain structure contains oxygen, and the oxide semiconductor nanostructure has a greater atomic concentration of oxygen than that of the source/drain structure. The semiconductor device structure further includes a gate stack wrapping around the oxide semiconductor nanostructure.

In accordance with some embodiments, a semiconductor device structure is provided. The semiconductor device structure includes an oxide semiconductor channel suspended over a substrate. The semiconductor device structure also includes an oxide semiconductor source/drain structure adjacent to the oxide semiconductor channel. The oxide semiconductor channel has a first atomic concentration of oxygen. The oxide semiconductor source/drain structure has a second atomic concentration of oxygen that is different than the first atomic concentration of oxygen. The semiconductor device structure further includes a gate stack wrapping around the oxide semiconductor channel.

In accordance with some embodiments, a method for forming a semiconductor device structure is provided. The method includes forming a stack over a substrate, and the stack has multiple sacrificial layers and multiple oxide semiconductor layers laid out alternately. The method also includes partially removing the sacrificial layers to form a recess exposing portions of the oxide semiconductor layers. Inner portions of the oxide semiconductor layers exposed by the recess form a plurality of oxide semiconductor nanostructures. The method further includes introducing oxygen into the oxide semiconductor nanostructures. In addition, the method includes forming a gate stack to wrap around at least one of the oxide semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   an oxide semiconductor channel suspended over a substrate;
   an oxide semiconductor source/drain structure adjacent to the oxide semiconductor channel, wherein the oxide semiconductor source/drain structure is thicker than the oxide semiconductor channel, the oxide semiconductor channel has a first atomic concentration of oxygen, and the oxide semiconductor source/drain structure has a second atomic concentration of oxygen that is different than the first atomic concentration of oxygen; and
   a gate stack wrapping around the oxide semiconductor channel.

2. The semiconductor device structure as claimed in claim 1, further comprising:
   a second oxide semiconductor channel between the substrate and the oxide semiconductor channel; and
   a second oxide semiconductor source/drain structure adjacent to the second oxide semiconductor channel, wherein the second oxide semiconductor channel has a greater atomic concentration of oxygen than that of the second oxide semiconductor source/drain structure.

3. The semiconductor device structure as claimed in claim 2, wherein the gate stack wraps around the second oxide semiconductor channel.

4. The semiconductor device structure as claimed in claim 2, further comprising a second gate stack wrapping around the second oxide semiconductor channel.

5. The semiconductor device structure as claimed in claim 4, further comprising a dielectric filling wrapping around the gate stack and the second gate stack.

6. A semiconductor device structure, comprising:
an oxide semiconductor nanostructure suspended over a substrate;
a source/drain structure adjacent to the oxide semiconductor nanostructure, wherein the source/drain structure contains oxygen, and the oxide semiconductor nanostructure has a greater atomic concentration of oxygen than that of the source/drain structure; and
a gate stack wrapping around the oxide semiconductor nanostructure, wherein a lower portion of the gate stack is under the oxide semiconductor nanostructure, and an upper portion of the gate stack is above the oxide semiconductor nanostructure.

7. The semiconductor device structure as claimed in claim 6, wherein the oxide semiconductor nanostructure has a center portion and an edge portion, the edge portion is between the center portion and the source/drain structure, the center portion has a first atomic concentration of oxygen, the edge portion has a second atomic concentration of oxygen, and the first atomic concentration of oxygen is greater than the second atomic concentration of oxygen.

8. The semiconductor device structure as claimed in claim 6, wherein the oxide semiconductor nanostructure is made of indium gallium zinc oxide having a first concentration of oxygen vacancy, the source/drain structure is made of indium gallium zinc oxide having a second concentration of oxygen vacancy, and the second concentration of oxygen vacancy is greater than the first concentration of oxygen vacancy.

9. The semiconductor device structure as claimed in claim 6, further comprising a metal layer adjacent to the metal oxide layer, wherein the metal layer and the metal oxide layer contains a same metal element.

10. The semiconductor device structure as claimed in claim 6, further comprising a spacer element between the gate stack and the source/drain structure.

11. The semiconductor device structure as claimed in claim 6, wherein the oxide semiconductor nanostructure is thinner than the source/drain structure.

12. The semiconductor device structure as claimed in claim 6, further comprising a metal oxide layer adjacent to the source/drain structure.

13. The semiconductor device structure as claimed in claim 6, further comprising a second oxide semiconductor nanostructure between the substrate and the oxide semiconductor nanostructure, wherein the gate stack wraps around the second oxide semiconductor nanostructure.

14. The semiconductor device structure as claimed in claim 13, further comprising a second source/drain structure adjacent to the second oxide semiconductor nanostructure, wherein the second oxide semiconductor nanostructure has a greater atomic concentration of oxygen than that of the second source/drain structure.

15. The semiconductor device structure as claimed in claim 14, further comprising a dielectric layer between the source/drain structure and the second source/drain structure.

16. A semiconductor device structure, comprising:
a semiconductor nanostructure suspended over a substrate;
a source/drain structure adjacent to the semiconductor nanostructure, wherein the semiconductor nanostructure has a first atomic concentration of oxygen, the source/drain structure has a second atomic concentration of oxygen, and the first atomic concentration of oxygen and the second atomic concentration of oxygen are different from each other; and
a gate stack wrapping around the semiconductor nanostructure, wherein a portion of the gate stack is between the semiconductor nanostructure and the substrate.

17. The semiconductor device structure as claimed in claim 16, wherein the semiconductor nanostructure is substantially as thick as the source/drain structure.

18. The semiconductor device structure as claimed in claim 16, wherein the semiconductor nanostructure is thinner than the source/drain structure.

19. The semiconductor device structure as claimed in claim 16, further comprising a second semiconductor nanostructure over the semiconductor nanostructure, wherein the second semiconductor nanostructure has a third atomic concentration of oxygen, and the third atomic concentration of oxygen is greater than the second atomic concentration of oxygen.

20. The semiconductor device structure as claimed in claim 19, wherein the gate stack is wrapped around the second semiconductor nanostructure.

* * * * *